United States Patent
Hirano et al.

(10) Patent No.: US 7,544,898 B2
(45) Date of Patent: Jun. 9, 2009

(54) MULTILAYER WIRING BOARD, TOUCH PANEL AND MANUFACTURING METHOD OF THE SAME

(75) Inventors: Tomio Hirano, Miyagi (JP); Masao Ono, Miyagi (JP); Nobuyuki Oikawa, Miyagi (JP)

(73) Assignee: Sony Corporation, Tokyo (JP)

( * ) Notice: Subject to any disclaimer, the term of this patent is extended or adjusted under 35 U.S.C. 154(b) by 308 days.

(21) Appl. No.: 10/678,062

(22) Filed: Oct. 6, 2003

(65) Prior Publication Data
US 2004/0074671 A1    Apr. 22, 2004

(30) Foreign Application Priority Data
Oct. 21, 2002  (JP)  ............................. 2002-306146

(51) Int. Cl.
*H05K 1/16* (2006.01)
(52) U.S. Cl. .................... 174/259; 361/803; 361/804
(58) Field of Classification Search ................. 174/259, 174/254, 267; 349/12; 361/803–804
See application file for complete search history.

(56) References Cited

U.S. PATENT DOCUMENTS

| | | | | |
|---|---|---|---|---|
| 5,031,308 A | * | 7/1991 | Yamashita et al. ............ 29/830 |
| 5,510,918 A | * | 4/1996 | Matsunaga et al. .......... 349/149 |
| 5,736,681 A | * | 4/1998 | Yamamoto et al. .......... 174/265 |
| 6,159,586 A | * | 12/2000 | Inoue et al. ................. 428/209 |
| 6,208,525 B1 | * | 3/2001 | Imasu et al. ................. 361/783 |
| 6,395,993 B1 | * | 5/2002 | Nakamura et al. .......... 174/254 |
| 6,807,064 B2 | * | 10/2004 | Hedler et al. ................ 361/767 |
| 2001/0011605 A1 | * | 8/2001 | Distefano et al. ........... 174/255 |
| 2001/0020985 A1 | * | 9/2001 | Hinata ......................... 349/12 |
| 2002/0172873 A1 | * | 11/2002 | Ueda et al. ..................... 430/7 |
| 2003/0034938 A1 | * | 2/2003 | Yamada ........................ 345/76 |

* cited by examiner

*Primary Examiner*—Jeremy C Norris
(74) *Attorney, Agent, or Firm*—Oblon, Spivak, McClelland, Maier & Neustadt, P.C.

(57) ABSTRACT

Providing a method for manufacturing a multilayer wiring board and a touch panel, which does not cause decreasing of yields, reliabilities and productivities even though the materials of each board to be stacked are different, and which manufactures the multilayer wiring board and the touch panel at low cost with high productivities. A multilayer wired board constituting at least part of a electrical circuit board in which a plurality of wired boards are stacked so as to face their wired surfaces each other, wherein: electrical connection parts between the multilayer wired boards are connected through an elastic conductive material part adhered to one of the wired boards; and at least part of a peripheral edge portion of the elastic conductive material part is adhered by a double-sided adhesive material part to seal the plurality of multilayer wired boards.

6 Claims, 4 Drawing Sheets

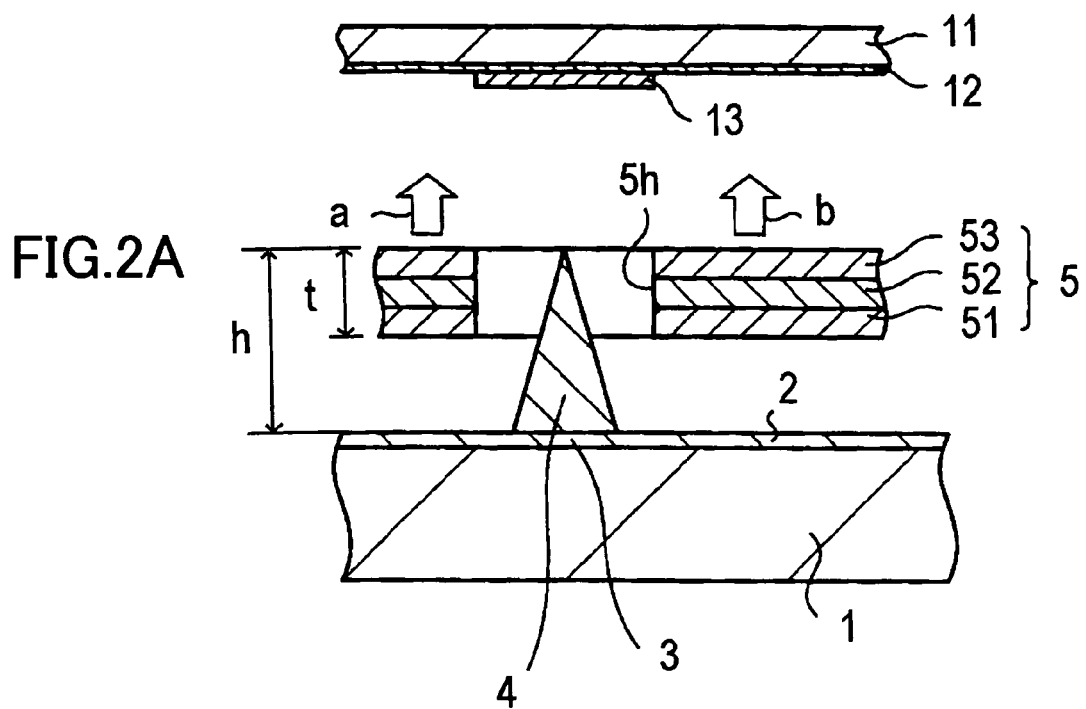
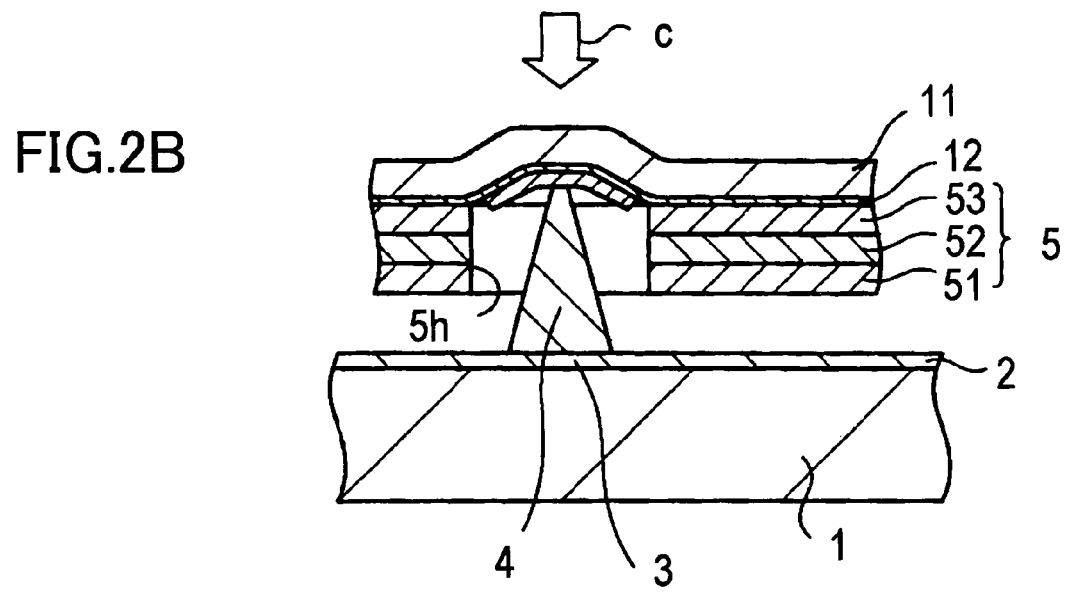

MULTILAYER WIRING BOARD, TOUCH PANEL AND MANUFACTURING METHOD OF THE SAME

CROSS REFERENCE TO RELATED APPLICATIONS

The present document is based on Japanese Priority Document JP2002-306146, filed in the Japanese Patent Office on Oct. 21, 2002, the entire contents of which being incorporated herein by reference.

DETAILED DESCRIPTION OF THE INVENTION

1. Field of the Invention

The present invention relates to a multilayer wiring board, a touch panel and a method of manufacturing of these.

2. Description of the Related Art

As a wiring connection method of a plurality of wiring boards, there are two methods proposed. One method is to connect by stacking boards so as to face their wired surfaces each other, the other method is to connect by stacking boards so as not to face their wired surfaces.

The method in which the boards are stacked so as not to face their wired surfaces, however, has problems as below. Usually, in order to carry out electrical connection between different circuit boards, using an elastic body, such as a spring or the like, to connect to at least one of the boards or forming through holes in the boards and filling conductive paste therein to establish connection are generally cited. In the case where the electrical connection is established by connecting boards with an elastic body, when using a metal having the high elastic modulus, such as phosphor bronze, a manufacturing process becomes longer because a technology for making a circuit board being conductive is necessary, individual exclusive parts are required, and man hour and cost are increased. In addition, imperfect contact of the electric circuits is occurred due to change in properties with time.

In the case where the electrical connection is established by filling conductive paste or conductive adhesive material in the through holes, electrically conduction resistance becomes high because of using the conductive paste or the conductive adhesive material at a connection part which is longer than a board thickness. In addition, it tends to be poor connection due to generating cracks by volumetric shrinkage at the time of desiccation hardening.

In addition, in the case where the electrical connection is established by bonding conductive resins with thermocompression bonding (Japanese Patent No. 2797552, for example), there are defects of low reliability in electrically and in mechanically due to having inferior thermal shock and mechanical property. Further, when circuits are connected by thermocompression bonding, film thickness control of the conductive paste or of the conductive adhesive material is difficult and stabilizing an adhesive strength is difficult because of unevenness bonding caused by thermocompression bonding. Furthermore, it tends to be poor connection due to generating cracks by volumetric shrinkage at the time of desiccation hardening.

In order to dissolve such problems, several methods are proposed in various ways, which establish the connection between boards by facing their wired surfaces. For example, there is a method in which an insulating layer is adhered onto a wired surface of a board by screen-printing, and an adhesive layer is formed there for adhering other board thereon. In this case, the electrical connection is established by providing through holes in the insulating layer and in the adhesive layer and filling the conductive paste therein.

In this case, however, there is the possibility that pinholes may occur in the insulating layer and in the adhesive layer due to mix in dust or foreign matter. Further, since the adhesive layer having an electrical insulation function is thin, there is a problem of low electrical insulation reliability. Furthermore, the electrical connection established with the conductive paste or with a hot melt type conductive sheet has a low adhesive strength depending on material of a board, and tends to change its properties with time by effect of temperature and humidity.

On the other hand, a method establishing the electrical connection between circuit boards using conductive materials having adhesive property and a double-sided adhesive sheet is proposed in, for example, Japanese Patent No. 2532267. In this method, between circuit boards, electrical connection parts are connected each other through the conductive material having adhesive property and non-electrical connection parts are connected each other through the double-sided adhesive sheet.

SUMMARY OF INVENTION

According to the above mentioned method, however, there are problems as below. In the method, the conductive material part is adhered so as to face the wired surface of the boards each other by heat curing or the like, under the state in which the conductive material having adhesive property is adhered to the electrical connection parts and the double-sided adhesive sheet surrounding the electrical connection parts are adhered on the board. For this reason, there is the possibility that adhesive strength of the double-sided adhesive sheet may be deteriorated in heat, so that poor adhesive strength becomes a cause of difficulty to lengthen its operating time.

In addition, like a wired surface of a touch panel, for example, in the case using a wiring board made of a glass substrate and a film base material, such as PET (polyethylene terephthalate), in other words, when the heat resistance of the boards to be stacked are different, there is a possibility that the adhesive strength of the double-sided adhesive sheet may be partially deteriorated. In addition, difference of expansion coefficient of boards may produce cracks and flakes, thereby lowering the yields and the reliabilities.

Instead of the above described method, another method using an ultraviolet curing type conductive adhesive material is considerable, for example, for the case where a board made of a material that transmits an ultraviolet light, however, this method requires preparing necessary manufacture apparatuses for process of ultraviolet irradiation operation, thus the cost may increase.

In addition, when adhesive process is carried out with heat or the like under the state in which the wired surfaces of both boards are faced to each other, if the pattern of an electrical connection parts is made in a finer scale along with the trend of miniaturization wiring pattern, aligning the boards with high accuracy is difficult, so that it may be a cause of poor connection and lowering the yield.

The present invention is accomplished in view of such problems and provides a method that can manufacture a multilayer wiring board without adhesive strength degradation and a multilayer wiring board holds enough adhesive strength even though at least one of the wiring boards is made of a low heat-resistance material. Specifically, methods of a manufacturing a multilayer wiring board and a touch panel, which does not cause decreasing of yields, reliabilities and productivities even though materials of the wiring boards to be stacked are different, like a touch panel structure. Further, the method of the present invention is possible to provide a multilayer wiring board and a touch panel at low cost with high productivities.

According to the present invention, there is provided a multilayer wired board constituting at least part of a electrical circuit board in which a plurality of wired boards are stacked so as to face their wired surfaces each other, wherein: electrical connection parts between the multilayer wired boards are connected through an elastic conductive material part adhered to one of the wired boards; and at least part of a peripheral edge portion of the elastic conductive material part is adhered by a double-sided adhesive material part to seal the plurality of multilayer wired boards.

In the above described configuration, the multilayer wired board according to the present invention, wherein the elastic conductive material part is formed in a convex shape, the bottom of the elastic conductive material part is adhered to one of the wired boards and the top of the elastic conductive material part is adhered to an electrical connection part of other side of the wired board, whereby electrical connection is established.

According to the present invention, there is provided a method of a multilayer wired board constituting at least part of a electrical circuit board in which a plurality of wired boards are stacked so as to face their wired surfaces each other, including the steps of: adhering an elastic conductive material part to an electric connection part of one of the wired boards; forming an opening in a double-sided adhesive material part so as to surround at least part of the peripheral edge of the elastic conductive material part; adhering the double sided adhesive material part to a wired board adhered the elastic conductive material part or other wired board whose wired surface to be faced to the wired surface; and adhering the both wired boards together by the double-sided adhesive material part under the state in which the top of the elastic conductive material part is contacted to the electrical connection part of the other wired board whose wired surface to be faced to the wired surface.

According to the present invention, there is provided a touch panel including the configuration such that a light transmission first board having a light transmission conductive layer formed as a predetermined pattern thereon and a light transmission second board made of a flexible material having a light transmission conductive layer thereon is placed opposite to the first board with a predetermined distance, wherein: electrical connection parts between the first board and the second board are connected through an elastic conductive material part adhered only to the first board, at least part of a peripheral edge portion of the elastic conductive material part is adhered by a double-sided adhesive material part to seal the first board and the second board.

According to the present invention, there is provided a method of a touch panel including the configuration such that a light transmission first board having a light transmission conductive layer formed as a predetermined pattern thereon and a light transmission second board made of a flexible material having a light transmission conductive layer thereon is placed opposite to the first board with a predetermined distance, including the steps of: adhering an elastic conductive material part to an electric connection part of the first board; forming an opening in a double-sided adhesive material part so as to surround at least part of the peripheral edge of the elastic conductive material part; adhering the double sided adhesive material part to the first board and the second; and adhering the both fist and second board together by the double-sided adhesive material part under the state in which the top of the elastic conductive material part is contacted to the electrical connection part of the second.

As described above, according to the invention, the electrical connection is established by having a configuration such that the elastic conductive material part is adhered to only the electrical connection part of one of the boards and the top of the elastic conductive material part contacts to the electrical connection part of the other board.

Therefore, even though the case where heat resistance properties of board materials are different, the electrical connection is securely established by adhering the elastic conductivity material part to the board being securely adherable, without losing electric property, and using the double-sided adhesive material part to adhere the boards each other, a satisfactory mechanical strength can be kept with the avoidance of generating flakes and cracks at a jointing portion. Therefore, the multilayer wiring board and the touch panel that have good yields, high reliabilities and productivities, and a method for manufacturing them can be provided.

In other words, according to the present invention, the process of adhering the elastic conductivity material part and the process of adhering the double-sided adhesive material part to the board are individually set up, that is, the electrical adhesive process and the mechanical adhesive process can be separated. Hence, when materials of boards to be stacked are different, a process that may deteriorate material's property like a heat process, or a processing position can be optimized. Therefore, the multilayer wiring board and the touch panel are produced in high reliabilities and yields, whereby yields and productivities can be improved.

For this reason, as an adhesive process of an electrical connection part, the most inexpensive and high productivity way of adhesive process by heat curing can be achieved, thereby lowering the cost of the multilayer wiring board and the touch panel.

Specifically, the structure for establishing electrical connection is made such that an elastic conductive material part is formed in a convex shape and to adhere its bottom to one of the wiring boards and to contact its top to the electrical connection part of the other side of the wiring board, the electrical connection can be established with appropriate connection resistance using tensile stress of the other wiring board to be stacked. That is, stabilization of the properties can be improved by suppressing the change in properties with time, thus the operating times of the multilayer wiring board and the touch panel can be lengthened.

Further, the height of the elastic conductive material part is set to 200-400 μm, generation of a defective is controlled and without disadvantage on appearance, the multilayer wiring board and the touch panel, which have satisfactory properties, can be provided.

BRIEF DESCRIPTION OF THE DRAWINGS

The above and other objects, features and advantages of the present invention will become more apparent from the following description of the presently preferred exemplary embodiments of the present invention taken in conjunction with the accompanying drawings, in which:

FIG. 2A shows an explanatory diagram of a manufacturing process of one example of method for manufacturing a multilayer wiring board;

FIG. 2B shows an explanatory diagram of one manufacturing process of one example of method for manufacturing a multilayer wiring board;

DESCRIPTION OF THE PREFERRED EMBODIMENT(S)

Detailed description of preferred embodiments of the present invention will be explained accompanying the drawings as follows, it will be understood that the present invention is not limited to the following examples and is possible for various kinds of deformation, modification.

As described above, the multilayer wiring board according to the present invention has a configuration in which the electrical connection parts between the wiring boards are connected each other through the elastic conductive material part adhered to one of the wiring boards and at least part of a peripheral edge of the elastic conductive material part is adhered with the double-sided adhesive material part to seal the wired boards.

Figure 1A:
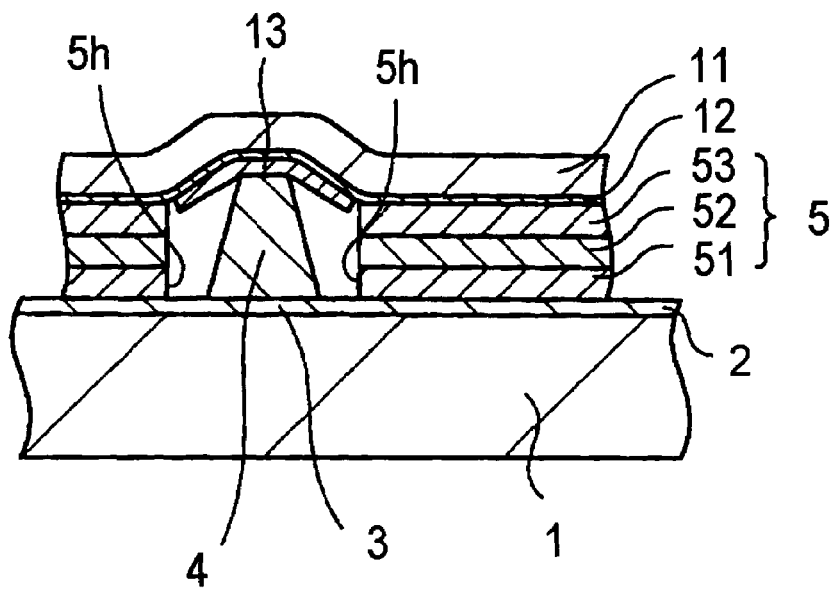
FIG. 1A shows an expanded sectional view of a main portion of one example of multilayer wiring board.

FIG. 1A is a sectional view showing a main portion of an example of the multilayer wiring board according to the present invention, the following reference numbers are respectively indicating each part. 1 is a wiring board, 2 is a wiring part constituted by a predetermined pattern conductive layer, 3 is an electrical connection part of the wiring part 2, 4 is an elastic conductive material part made of silver paste or the like, 5 is a double-sided adhesive material part, 5h is an opening of the double-sided adhesive material part, 11 is another wiring board which is stacked so as to face its wired surface to the wired surface of the bored 1, 12 is a wiring part formed on the wiring board 11 as a predetermined wiring pattern, and 13 is an electrical connection part.

In this example, the electrical connection part 3 of the board 1 side is shown as a predetermined position on the wiring board 2, the electrical connection part 13 of the upper wiring board 11 has a conductive layer made of silver paste or the like at a predetermined position of the wiring part 12 to hold a good electric conductivity at the connection part, however, if good enough connection resistance is possible to obtain, the conductive layer is unnecessary. Alternatively, in similar way of the upper wiring board 11, electrical connection part 3 can be provided by forming a conductive layer on the board 1 side.

The double-sided adhesive material part 5 is constituted by a base material made of, for example, PET, and is sandwiched and adhered between adhesive layers 51 and 53.

Figure 1B:
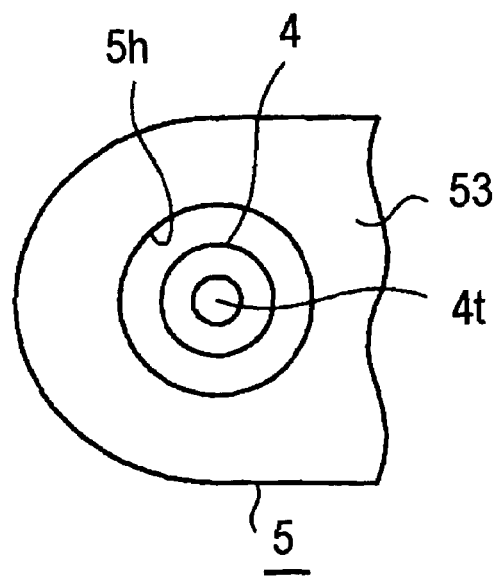
FIG. 1B shows a plane block diagram of one example of elastic conductive material part and double-sided adhesive material part.

FIG. 1B shows one example of a plane structure of the elastic conductive material part 4 and the double-sided adhesive material part 5. At the top 4t of the elastic conductive material part 4, the electrical connection is established with the electrical connection part 13 of the upper wiring board 11 in FIG. 1A. In addition, FIG. 1B shows a case where an opening is formed so as to surround at least a part of a peripheral edge of the elastic conductive material part 5 in the double-sided adhesive material part 5, which is a substantially circular shaped opening 5h in the figure. It should be noted that the shape and appearance of the opening of the double-sided adhesive material part 5 is not being limited to the example of the figure, however, the shape can be selected appropriately in accordance with the condition of the wiring pattern of the wiring board 1 and 11, that is, in accordance with the shape of portion in need of electrical insulation.

Nevertheless, as the shape of the double-sided adhesive material part 5, it is desirable to be a shape that supports a peripheral edge part at more than two places using the elastic conductive material part 4 as a support point. By forming the double-sided adhesive material part 5 as above, it is pressed to the electrical connection part of the upper wiring board 11 with enough tensile stress of the double-sided adhesive material part 5, so that electrical connection can be satisfactory established.

The elastic conductive material part 4 is formed, for example, a convex cone shape in the figure, its bottom is adhered to the electrical connection part 3 of the wiring board 1, however, its top 4t is not adhered to the electrical connection part 13 of the wiring board 11, but only contacted thereto.

Here, the height t of the double-sided adhesive material part 5 is made smaller as compared to the height h of the elastic conductive material part 4, when the wiring board 11 is adhered to the wiring board 1 with the both-sided adhesive material part 5, the electrical connection part 13 and its peripheral part of the wiring board 11 and are bended and pressed with enough stress, whereby a good electrical connection is kept between the electrical connection part 3 of the wiring board 1 and the electrical connection part 13 of the wiring board 11.

In this case, even if the heights of the both-sided adhesive material part 5 and the elastic conductive material part 4 are different, because of using deflection of upper wiring board 11, stress is generated between the wiring board 11 and the elastic conductivity material part 4 of electrical connection part, whereby a good electric connection condition in the electric and the mechanical properties can be kept.

Next, one example of method for manufacturing such multilayer wiring board is explained with reference to FIGS. 2A and 2B. As shown in FIG. 2A, the predetermined pattern conductive layer 2 is adhered onto a wiring board 1 by applying photolithography, that is, processes of coating photoresist, pattern exposure, development, sputtering using the resist pattern as a mask and the like are carried out. After these processes, the elastic conductive material part 4 is adhered to the predetermined electrical connection part 3 of the conductive layer 2. In other words, for example, silver paste is pattern formed in a convex like a cone shape with an injection tool, such as a dispenser. At this time, by controlling an amount of paste injected from the dispenser, the height h of the elastic conductive material part 4 can be formed bigger as compared to the thickness t of the double-sided adhesive material part 5, which will be explained later.

To the other wiring board 11, which is to be stacked on the wiring board 1, the wiring part 12 is formed by applying photolithography with a predetermined pattern in the similar manner as the conductive layer 2. In the example in FIG. 2A, the conductive layer made of ITO. (Indium Tin Oxide) or the like is formed to be the wiring part 12 by patterning as the predetermined pattern, and the conductive layer made of silver paste or the like is pattern formed at the electrical connection part 13 on the wiring part 12.

The double-sided adhesive material part 5 is constituted by a base material made of, for example, PET, and is sandwiched and adhered between adhesive layers 51 and 53, and an opening is formed therein so as to surround at least a part of a peripheral edge of the elastic conductive material part 4. In this case, the circular shaped opening 5h is formed in the double-sided adhesive material part 5.

And the double-sided adhesive material part 5 is adhered to the wiring board 1 or the wiring board 11. In the example in FIG. 2A, as showing direction of arrows a and b, at first the opening 5h is aligned with the electrical connection part 13 of the upper wiring board 11, and adhered to each other.

Further, as showing FIG. 2B, the wiring board 1 and 11 are adhered to each other with the double-sided adhesive material part 5 under the state in which the electrical connection part 13 of the upper wiring board 11 is contacted with the top of the elastic conductive material part 4 on the electrical connection part 3 of the lower wiring board 1. In other words, aligning the top of the elastic conductive material part 4 with the opening 5h, and the wiring board 11 is pressed down to the wiring board 1 with a predetermined pressure as showing direction of an arrow c. Thus, the wiring board 1 and 11 are adhered to each other holding with the predetermined mechanical strength by an adhesive material of the double-sided adhesive material part 5.

In this adhesive process, because a heat process is not included at all, even if, for example, a heat resistance or an expansion coefficient is very different between materials of the wiring board 1 and 11, disadvantages can be avoided, such as deteriorates of the wiring board material by heat, generating cracks by expansion and deflation, or flakes of adhesive material.

Next, a touch panel and its manufacturing method according to the present invention are explained in detail with reference to the FIGS. 3A and 3B.

Figure 3A:
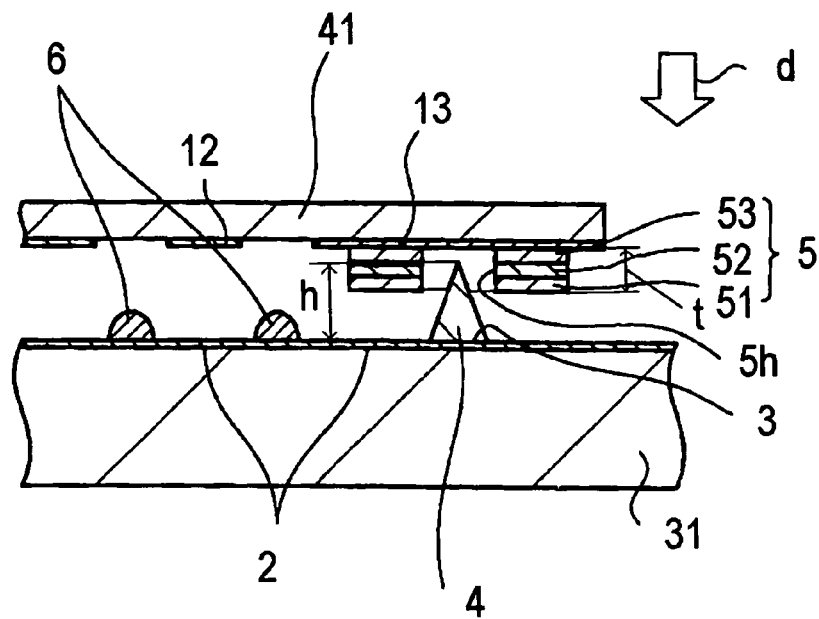
FIG. 3A shows an explanatory diagram of manufacturing process of one example of method for manufacturing a touch panel.
Figure 3B:
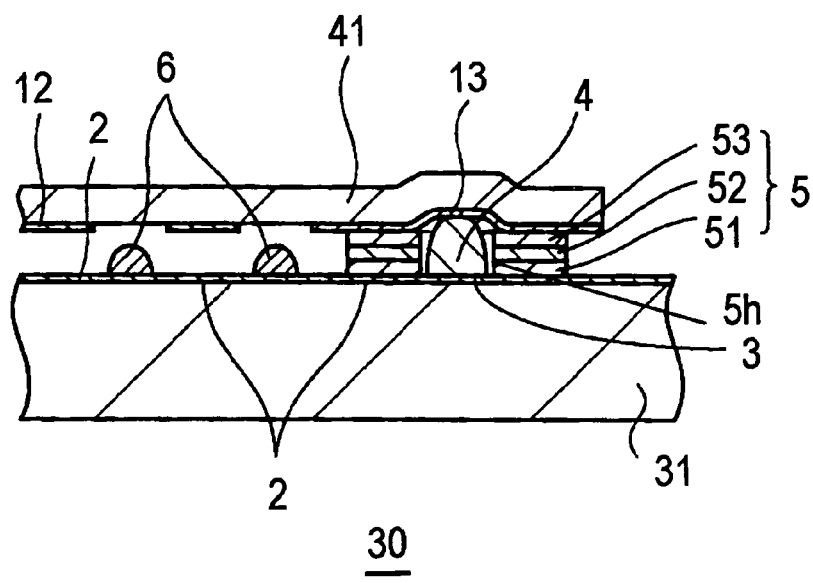
FIG. 3B shows an expanded sectional view of a main portion of one example of touch panel.

In FIG. 3A, a reference number 31 is a first board made of a material having light transmission property such as glass, a wiring part 2, for example, a light transmission conductive layer, made of such as ITO, is formed thereon as a stripe-shaped pattern extending in the crosswise direction in the FIG. 3.

On an electrical connection part 3 of the wiring part 2, an elastic conductive material part 4 is formed, for example, a convex like a cone shape. A reference number 6 is indicates a dot spacer made of a acrylic resin or the like for holding a space between the lower first board 31 and an upper second board 41. The height h of the elastic conductive material part 4 can be formed bigger as compared to the thickness t of the double-sided adhesive material part 5, which will be explained later.

The second board 41 faced to the first board 31 is made of flexible material having light transmission property such as PET, a wiring part 12 constituted by the light transmission conductive layer made of such as ITO is formed thereon as a stripe-shaped pattern in the direction of perpendicular to the paper of FIG. 3A. In other words, the wiring part 12 is formed as a stripe-shaped pattern to be crossed to the wiring layer 2 on the first board 31 by applying the photolithography or the like.

And then, the double-sided adhesive material part 5 is adhered onto the first board 31 or onto the second board 41. In the example of the figure, the double-sided adhesive material part 5 is adhered to a peripheral edge of the electrical connection part 13 of the wiring part 12 of the second board 41. In the similar way of the examples of the multilayer wiring board described in the FIGS. 1A, 1B, 2A and 2B, the double-sided adhesive material part 5 is constituted by a base material made of, for example, PET, and is sandwiched and adhered between layers 51 and 53 and has a circular opening 5h therein.

Under the state of the above, the electrical connection part 13 of the second board 41 is aligned with the elastic conductive material part 4 on the electrical connection part 3 of the first board, and the second board 41 is adhered onto the first board 31 as shown direction of an arrow d. Both boards 31 and 41 are adhered each other with enough mechanical strength by adhesive material of the double-sided adhesive material part 5, whereby a touch panel 30 according to the configuration of the present invention can be obtained.

The touch panel 30 having such configuration can be used same as a usual touch panel. When a predetermined place of the second board 41 is pressed from the outside with a support medium, such as a pen or a finger, the wiring part 2 and 12 positioned at the pressed place are electrically conducted, so that the pressed place can be detected by measuring variation of applied potential varying according to electrically conducted positions of each wiring part 2 or 12.

Specifically, the touch panel according to the present invention, even if the heat resistance and the coefficient of expansion are different between the first board made of glass and the second board made of film base material at pressed side are different, electrically conduction can be derived by only adhering the elastic conductive material part to one of the boards by heat curing, and by only contacting the elastic conductive material part to the other board made of film base material having relatively low heat resistance with tensile stress. Thus, flaking and generating cracks at a jointing portion of the electrical connection part can surely be avoided.

Therefore, as a method for adhering the elastic conductive material part, the present invention do not require an expensive apparatus for ultraviolet curing process, such as a black light, whereby the cost can be suppressed and a manufacturing process can be made simple.

Further, the present invention can provide the touch panel that holds the connection property while holding the mechanical connection strength at the electrical connection part, and that also has a good yield and high reliability.

EXAMPLES

The examples in which the present invention is applied to a multilayer wiring board, a touch panel and a method for manufacturing them are explained.

Example 1

In this example, a multilayer wiring board in which a flexible print wiring board was stacked on a glass wiring board having a light transmission conductive layer made of ITO was produced.

At first, in the similar way as the example explained in FIG. 2A, a wiring board 11 made of PET film of 188 μm in thickness having a wiring part 12 thereon constituted by a predetermined wiring pattern made of ITO was prepared. Silver paste (#LS-504J (M-2), Product of Asahi Chemical Co., Ltd.) was adhered to an electrical connection part on the wiring board 11 by screen printing, and desiccation was carried out at 145° C. for 30 minutes for heat curing to form an electrical connection part 13, thus the wiring board 11 having a flexible print type structure was formed.

Next, on a wiring board 1 having a thickness of 0.7 mm made of soda glass, forming a conductive layer 2 made of ITO as a predetermined pattern by a deposition method, silver paste (#2000-D1, Product of Asahi Chemical Co., Ltd.) was injected to an electrical connection part 3 connected to the wiring board 11 to be stacked with a dispenser or the like as a convex cone shape to have a predetermined height, and heat cured it at 120° C. for 20 minutes, thus an elastic conductive material part 4 was formed.

Next, a double-sided adhesive material part 5 having a circular opening 5h was formed by making through holes of 1.4 mm in diameter with a die in a double-sided adhesive sheet of 40 or 60 μm in thickness (Products of Nitto Denko Corporation).

After having aligned the electrical connection part 13 of the wiring board 11 with the opening 5h of the double-sided adhesive material part 5, they were adhered each other by removing a release paper of the double-sided adhesive material part 5. Then, after the elastic conductive material part 4 of the wiring board 1 was aligned with the electrical connection part 13 of the wiring board 11 so as to be contacted, another side of the release paper of the double-sided adhesive material part 5 was removed to adhere the wiring board 1 to wiring board 11, whereby the multilayer wiring board was formed.

It should be noted that, it is preferable that the height of the elastic conductive material part 4 is selected in consideration of the thickness of the double-sided adhesive material part 5. However, since a double-sided adhesive material part described below, which has a thickness of 40 μm or 60 μm, has small thickness difference, satisfactory resultant was able to be obtained when the height of the elastic conductive material 4 was set to 200-400 μm for both thicknesses.

In the multilayer wiring board having the above described material structure, when the double-sided adhesive material part 5 has a thickness of 40 and 60 μm, varying the height of the elastic conductive material part 4, that is, from the bottom to the top of the elastic conductive material part 4, the number of non-conductive multilayer wiring board sample among 6 samples were counted at the initial state and after an accelerated test (samples were left in a constant-temperature bath of 70° C. for 240 hours). The result of the case of the double-sided adhesive material part 5 of 40 μm in thickness is shown in the table 1, and the case of 60 μm in thickness thereof is shown in the table 2, along with showing appearance conditions of samples.

TABLE 1

| Height of the elastic conductive material part | Initial state non-conductive sample number/ total sample number | After an accelerated test non-conductive sample number/ total sample | Appearance condition |
| --- | --- | --- | --- |
| 100 μm | 0/6 | 2/6 | Flat |
| 200 μm | 0/6 | 0/6 | Small convex Shape |
| 300 μm | 0/6 | 0/6 | Small convex Shape |
| 400 μm | 0/6 | 0/6 | Small convex Shape |
| 500 μm | 0/6 | 0/6 | Large convex Shape Bad |

TABLE 2

| Height of the elastic conductive material part | Initial state non-electrically conduction sample number/ total sample number | After an accelerated test non-electrically conduction number sample/total sample number | Appearance condition |
| --- | --- | --- | --- |
| 100 μm | 0/6 | 4/6 | Flat |
| 200 μm | 0/6 | 0/6 | Flat |

TABLE 2-continued

| Height of the elastic conductive material part | Initial state non-electrically conduction sample number/ total sample number | After an accelerated test non-electrically conduction number sample/total sample number | Appearance condition |
| --- | --- | --- | --- |
| 300 μm | 0/6 | 0/6 | Small convex Shape |
| 400 μm | 0/6 | 0/6 | Small convex Shape |
| 500 μm | 0/6 | 0/6 | Large convex Shape Bad appearance condition |

From these resultants, it is understand that the height of the elastic conductive material part 4 is preferable to set to 200-400 μm. When the height is less than 200 μm, a tension between the boards becomes small, and connection between the electrodes of boards becomes unstable. On the other hand, when the height is greater than 400 μm, an adhesive force to the double-sided adhesive material part 5 becomes low.

A multilayer wiring board is prepared to have the selected height as above, the acceleration test was carried out for it, such that the multilayer wiring board was left in a constant-temperature bath at 70° C. for 240 hours. After the test, it was confirmed that electrically conduction between the electrical connection parts 3 and 13 was not changed and the mechanical strength of the double-sided adhesive material part 5 was not deteriorated.

Example 2

Next, a touch panel constituted in accordance with the present invention was prepared with same constitution materials as the multilayer wiring board in Example 1, that is, soda glass was used as a first board and film base material made of PET was used as a second board, other parts of the touch panel were used similar materials as Example 1.

Further, in the similar way of the example explained in FIGS. 2A and 2B, as wiring parts 2 and 12, a light transmission conductive material made of ITO was formed by applying photo lithography in stripe-shaped pattern so as to be perpendicular each other. In addition, on the wiring part 2 of the first board 31, a dot spacer 6 made of an acrylic resin was formed by screen-printing.

Figure 4A:
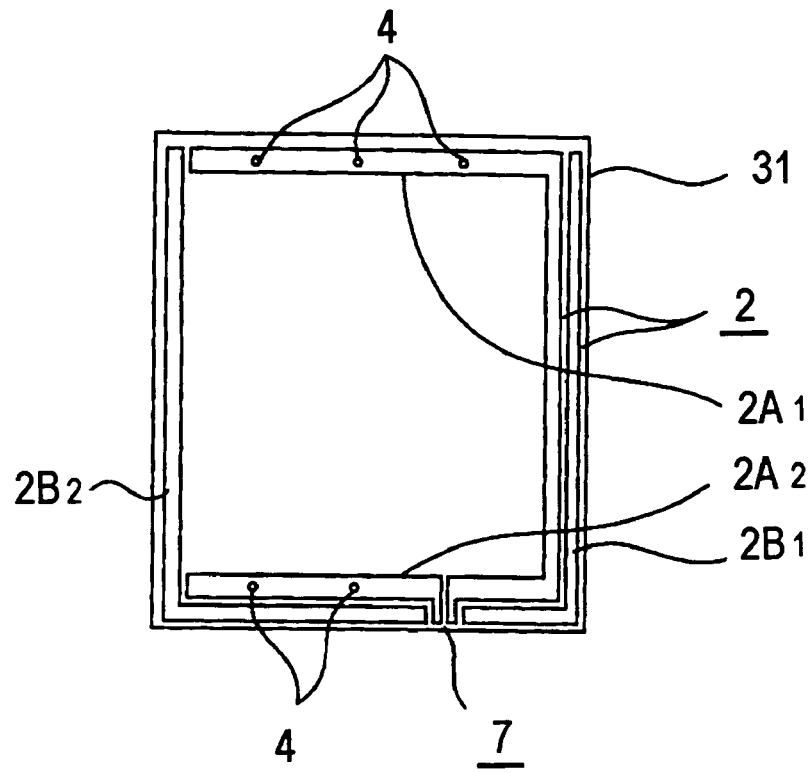
FIG. 4A shows an explanatory diagram of a manufacturing process of one example of method for manufacturing a touch panel.

In FIG. 4A, a plane constitution of the wiring part 2 of the first board 31 side is shown. In wiring parts made of ITO formed as the perpendicular pattern to the first and the second board of the touch panel, respectively, wiring patterns to be applied electric potential for detecting a location pressed was formed, respectively. In FIG. 4A, to easy understand about the wiring parts 2, which configure electrical connection parts, a stripe-shaped wiring pattern made of ITO was omitted.

In this example, as shown in FIG. 4A, wiring parts 2 were configured by one side of a first board 31 (the top edge in the figure), wiring parts $2A_1$ and $2A_2$ extending like a belt along the other edge facing the top edge (the bottom edge in the figure), and wiring parts $2B_1$ and $2B_2$ which were respectively extending along the right edge and the left edge of the touch panel in the figure.

To each wiring part, $2A_1$, $2A_2$, $2B_1$ and $2B_2$, an extraction electrode was provided at a connection part 7 for connecting to a user connector. To the wiring part $2A_1$, the extraction electrode was formed from the top edge along the right edge, that is, along inside of the wiring part $2B_2$ in this example, to be extended to the connection 7 as a pattern extending to the connection 7 of the bottom edge.

In this example, electrical connection parts connected to a second board were provided in the wiring part $2A_1$ and $2A_2$. In the example shown in the figure, five elastic conductive material parts 4 were formed, that is, three in the wiring part $2A_1$ of the top edge and two in the wiring part $2A_2$ of the bottom edge, by injecting silver paste (#2000-D1, Product of Asahi Chemical Co., Ltd.) with a dispenser and heat curing them at 120° C. for 20 minutes.

Figure 4B:
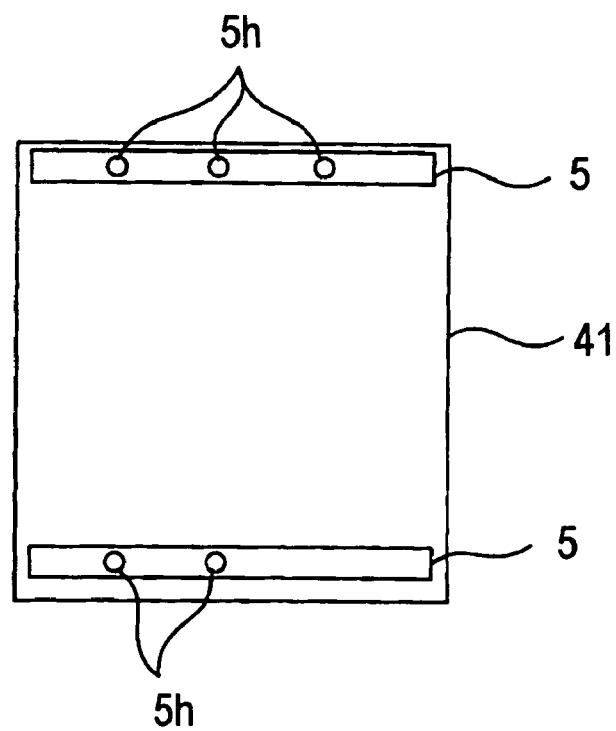
FIG. 4B shows an explanatory diagram of a manufacturing process of one example of method for manufacturing a touch panel.

On the other hand, at an electrical connection part of the second board 41 of 188 μm in thickness made of PET, silver paste (#LS-504J(M-2), Product of Asahi Chemical Co., Ltd.) was adhered by screen printing. As shown one example of a plane configuration in FIG. 4B, double-sided adhesive material parts 5 made of double-sided adhesive sheets of 60 μm in thickness (product of Nitto Denko Corporation) were adhered by removing release papers at positions where the pattern of the wiring parts $2A_1$ and $2A_2$ of the second board 41 were corresponded to, that is, the double-sided adhesive material sheets were adhered so as to extend along the top edge and along the bottom edge.

In the double-sided adhesive material part 5, openings were formed so as to correspond to the pattern of the elastic conductive material part 4 explained in FIG. 4A, for example, openings 5h having a diameter of 1.4 mm were formed by punching with a die.

After that, the top of the elastic conductive material part 4 was aligned with the openings 5h of the double-sided adhesive material part 5 so as to adhere the first board 31 to the second boards 41 by removing another side of release paper of the double-sided adhesive material part 5, whereby the touch panel in accordance with the configuration of the present invention was obtained.

Further, it is confirmed that the touch panel made in this way also has a good electrical connection property at the electrical connection part and enough mechanical strength at the jointing portion by setting the height of the elastic conductive material part 4 to 200-400 μm.

Furthermore, 10 samples of the touch panel made of same materials as above were prepared, and following tests were carried out. That is, a high temperature holding test in which a sample was left in a constant-temperature bath at 70° C. for 240 hours, a low temperature holding test in which a sample was left in a constant-temperature bath at −30° C. for 240 hours, a high temperature and humidity test in which a sample was left in a constant-temperature bath at temperature 60° C. and humidity 90% for 240 hours and a heat shock test in which a sample was left in a temperature cycle of −30° C. for 30 minutes and 70° C. for 30 minutes, and repeating this cycle for 100 times. After each test, samples were measured under the following conditions. That is, Film expansion dimension (satisfactory if it is less than 300 μm)

Insulating resistance (satisfactory if it is more than 200M Ω)

Resistance value of the first board side (satisfactory if it is 200-600 Ω)

Resistance value of the second board side (satisfactory if it is 200-600 Ω)

Linearity of the first board side (satisfactory if it is less than 1.5%)

Linearity of the second board side (satisfactory if it is less than 1.5%)

Newton ring (satisfactory if it is not observed)

Linearity is the way to confirm that a resistance value is increased linearity with the first order by measuring a resistance value at some position along a line drawn between facing corners of the first and the second boards, and it is determined with a slippage from the ideal curve (%).

TABLE 3

| | High temperature holding test (70° C. for 240 hours) | Low temperature holding test (−30° C. for 240 hours) | High temperature and humidity (temperature 60° C. and humidity 90% for 240 hours) | Heat shock (−30° C. to 70° C.) |
|---|---|---|---|---|
| Film expansion dimension (μm) [less than 300 μm] | ○ | ○ | ○ | ○ |
| Insulating resistance (MΩ) [more than 200 MΩ] | ○ | ○ | ○ | ○ |
| Resistance value of the first board side (Ω) [200-600 Ω] | ○ | ○ | ○ | ○ |
| Resistance value of the second board side (Ω) [200-600 Ω] | ○ | ○ | ○ | ○ |
| Linearity of the first board side (less than 1.5%) | ○ | ○ | ○ | ○ |
| Linearity of the second board side (less than 1.5%) | ○ | ○ | ○ | ○ |
| Newton ring (Not observed) | ○ | ○ | ○ | ○ |

*○ indicates a satisfactory result.

From the above results, it is understood that the touch panel in accordance with the configuration of the present invention is very satisfied with electrical property, surface smoothness and mechanical property.

Furthermore, it was confirmed that the touch panel operated normal after operation tests were carried out, such as a high temperature and humidity atmosphere test in which the touch panel was made to operate in a constant-temperature bath at temperature 45° C. and humidity 80% for 8 hours, and a low-temperature atmosphere test in which the touch panel was made to operate in a atmosphere at −10° C. for 3 hours.

As described above, according to the present invention, even though the materials of each board to be stacked are different, the multilayer wiring board and the touch panel can be obtained with satisfactory mechanical strengths, securely being conducted electrical connection parts, and good yields and high reliabilities.

It should be noted that the present invention is not limited to the embodiments described above, and is possible to apply for other various kinds of multilayer wiring board and manufacturing methods and also possible to apply for touch panels having other various kinds of material structures unless departing from the scope of the present invention.

What is claimed is:

1. A multilayer wired board including at least part of an electrical circuit board in which a plurality of wired boards are stacked so as to face their wired surfaces toward each other, comprising:

electrical connection parts between said wired boards are connected through a first end of an elastic conductive material part adhered to a first wired board, and a second end of the elastic conductive material part in contact with a second wired board;

a double-sided adhesive material part is provided between the plurality of wired boards to adhere them together, and an opening is formed in the double-sided adhesive material part so as to surround at least part of a peripheral edge portion of said elastic conductive material part to seal said plurality of wired boards;

wherein a height of said double-sided adhesive material part is smaller than a height of said elastic conductive material part, the second end of the elastic conductive material part and a peripheral part of the second wired board are bent and pressed together, and said elastic conductive material part does not contact said double-sided adhesive material part.

2. The multilayer wired board according to claim 1, wherein said elastic conductive material part is formed in a convex shape, the bottom of said elastic conductive material part is adhered to the first wired board and the top of said elastic conductive material part is adhered to an electrical connection part of the second wired board, whereby electrical connection is established.

3. The multilayer wired board according to claim 1, wherein said elastic conductive material part is formed in a convex shape and the height from the bottom to the top of said elastic conductive material part is set to 200-400 μm.

4. A touch panel, comprising:

a light transmission first board having a light transmission conductive layer formed as a predetermined pattern thereon and a light transmission second board made of a flexible material having a light transmission conductive layer thereon and opposing said first board by a predetermined distance;

electrical connection parts between said first board and said second board being connected through a first end of an elastic conductive material part adhered only to said first board, and a second end of the elastic conductive material part in contact with the second board;

a double-sided adhesive material part provided between the first board and the second board to adhere them together, and an opening being formed in the double-sided adhesive material part so as to surround at least part of a peripheral edge portion of said elastic conductive material part to seal said first board and said second board;

wherein a height of said double-sided adhesive material part is smaller than a height of said elastic conductive material part, the second end of the elastic conductive material part and a peripheral part of the second board are bent and pressed together, and said elastic conductive material part does not contact said double-sided adhesive material part.

5. The touch panel according to claim 4, wherein said elastic conductive material part is formed in a convex shape, the bottom of said elastic conductive material part is adhered to said first board and the top of said elastic conductive material part is adhered to an electrical connection part of said second board, whereby electrical connection is established.

6. The touch panel according to claim 4, wherein said elastic conductive material part is formed in a convex shape and the height from the bottom to the top of said elastic conductive material part is set to 200-400 μm.

* * * * *